(12) United States Patent
Rahim et al.

(10) Patent No.: US 8,704,313 B1
(45) Date of Patent: Apr. 22, 2014

(54) LOW CAPACITANCE, LOW ON RESISTANCE ESD DIODE

(75) Inventors: Irfan Rahim, San Jose, CA (US); Cheng-Hsiung Huang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 1219 days.

(21) Appl. No.: 11/406,694

(22) Filed: Apr. 18, 2006

(51) Int. Cl.
*H01L 29/78* (2006.01)

(52) U.S. Cl.
USPC .......................................................... 257/413

(58) Field of Classification Search
USPC .......................................................... 257/413
See application file for complete search history.

(56) References Cited

U.S. PATENT DOCUMENTS

2003/0080386 A1\* 5/2003 Ker et al. ..................... 257/347
2005/0231793 A1\* 10/2005 Sato .............................. 359/291

\* cited by examiner

*Primary Examiner* — Jae Lee
(74) *Attorney, Agent, or Firm* — Ward & Zinna, LLC

(57) ABSTRACT

An electrostatic discharge (ESD) protection structure comprising a polysilicon gate on an insulating layer on a substrate, said gate having first and second sides, a first heavily doped P-region in the substrate on the first side of the gate, a first heavily doped N-region in the substrate on the second side of the gate, and a shallow trench isolation isolating said first P-region and said first N-region from other structures in the substrate. In a first embodiment, the heavily doped regions are formed in a well having opposite conductivity to that of the substrate and a diode is formed at a PN junction between one of the heavily doped regions and the well. To minimize capacitance between the well and the substrate, the substrate is doped at a level of native doping and the well is isolated so that no other wells or heavily-doped regions are nearby in the substrate. Doping levels in the well and the dimensions of the gate are controlled to minimize on resistance ($R_{on}$) of the diode. In a second embodiment, no well is used.

20 Claims, 4 Drawing Sheets

LOW CAPACITANCE, LOW ON RESISTANCE ESD DIODE

FIELD OF THE INVENTION

This relates to a low capacitance, low on resistance ($R_{on}$), electrostatic discharge (ESD) protection device and a method for its manufacture.

BACKGROUND OF THE INVENTION

Electrostatic discharge is a major source of failure in integrated circuits. Unless appropriate measures are taken to prevent it, an electrostatic charge can build up on an integrated circuit (IC) that has sufficient energy to destroy part of the IC during its discharge. A detailed discussion of ESD is found in A. Amerasekera et al., *ESD in Silicon Integrated Circuits*, 2d ed., Wiley 2002, which is incorporated herein by reference.

FIG. 1 illustrates a conventional ESD protection circuit 100 for high speed input/output circuits for an integrated circuit. Circuit 100 comprises an input/output pad 110 connected to an input/output lead 120, a ground lead 130, a silicon controlled rectifier (SCR) 140 connecting the input/output lead 120 and ground lead 130, and a trigger device 150. The circuits to be protected are schematically represented by block 160. When an over voltage condition is detected on input/output lead 120, SCR 140 turns on to discharge the voltage to ground, thereby protecting the circuits 160 from the over voltage. Circuits such as that of FIG. 1 are disclosed, for example in Mergens et al., U.S. Pat. No. 6,803,633, which is incorporated herein by reference.

Unfortunately, the turn on time of an SCR is relatively long while certain electrostatic discharge phenomena are quite fast. For example, electrostatic discharges associated with manufacturing and chip handling equipment tend to be extremely fast, high voltage pulses. This type of phenomena, which is referred to under the terms Charged Device Model (CDM) and Field Induced Charged Device Model (FCDM), is described in greater detail at pages 12-14 and 28-40 of *ESD in Silicon Integrated Circuits*, which is incorporated herein by reference. Because SCRs are relatively slow, SCRs are barely meeting the requirements for CDM tests in some modern process technologies.

SUMMARY OF THE PRESENT INVENTION

The present invention is a high speed diode suitable for use as an ESD protection device. The diode achieves its high speed with a lower capacitance, lower on resistance ($R_{on}$) structure that can be achieved using available process technologies.

In a preferred embodiment, an electrostatic discharge (ESD) protection structure of the present invention comprises a polysilicon gate finger on an insulating layer on a semiconductor substrate, said finger having first and second sides, a heavily doped P-region in the substrate on the first side of the finger, a heavily doped N-region in the substrate on the second side of the finger, and a shallow trench isolation isolating the first P-region and the first N-region from other structures in the substrate. In one embodiment, the heavily doped regions are formed in a well having opposite conductivity to that of the substrate and a diode is formed at a PN junction between one of the heavily doped regions and the well. To minimize capacitance between the well and the substrate, the substrate is doped at a level of native doping and the well is isolated from other wells in the substrate. Doping levels in the well and the distance between the heavily doped regions are controlled to minimize the on resistance ($R_{on}$) of the diode. In another embodiment, no well is used. Advantageously, the structures of the present invention may be made with standard process technologies.

BRIEF DESCRIPTION OF THE DRAWINGS

These and other objects and advantages of the present invention will be apparent to those of ordinary skill in the art in view of the following Detailed Description in which.

DETAILED DESCRIPTION

Figure 1:
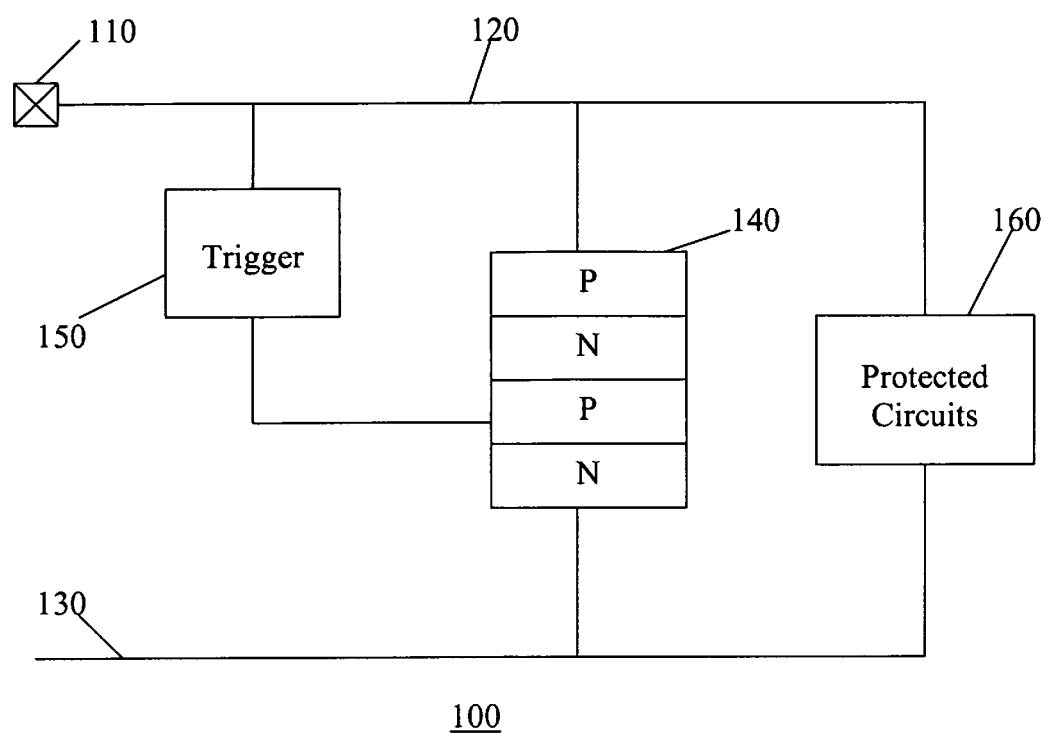
FIG. 1 is a schematic illustration of a prior art SCR ESD protection device.
Figure 2:
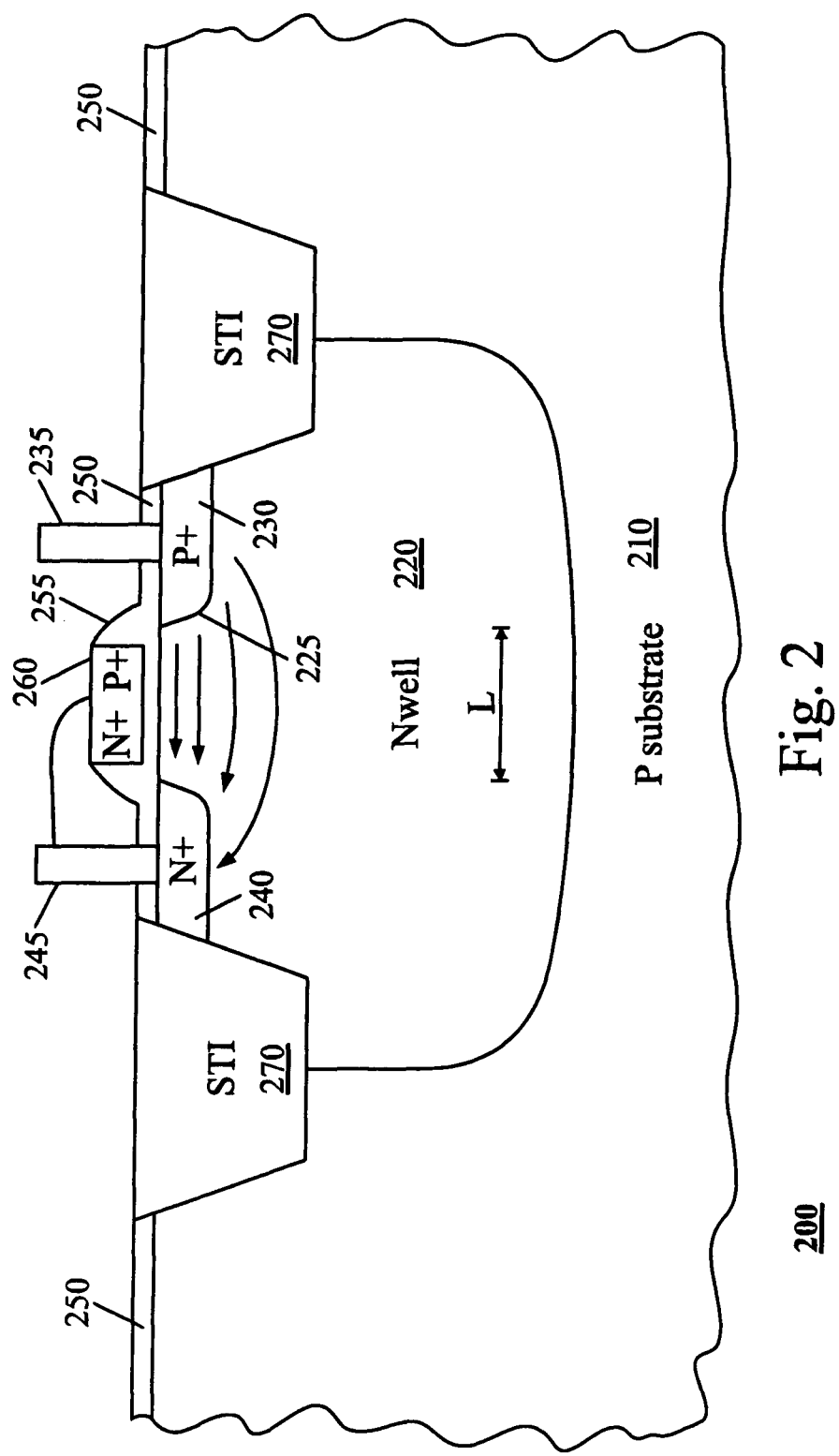
FIG. 2 is a cross-section of a first illustrative embodiment of the invention.

FIG. 2 is a schematic cross-section of a first embodiment of an ESD protection device 200 of the present invention. As will be appreciated by those skilled in the art, the area shown in the cross-section is only a small portion of a much larger integrated circuit in which numerous other devices are located. Device 200 comprises a semiconductor substrate 210 of a first conductivity type in which there is a well 220 of a second conductivity type and highly doped regions 230, 240 of the first and second conductivity types located in well 220. Illustratively, the substrate is single crystal silicon. A diode 225 is formed at a PN junction between region 230 and well 220. An insulating layer 250 is formed on a surface of the substrate and a polysilicon gate 260 is located on the insulating layer between the highly doped regions 230, 240. As indicated, the gate is doped with dopants of the first conductivity type adjacent region 230 and the second conductivity type adjacent region 240. The gate has sidewalls 255 of an insulating material that may be the same as that of insulating layer 250. Electrical connection to regions 230, 240 is made by contacts 235, 245, thereby providing connections to the anode and cathode of diode 225. A shallow trench isolation (STI) region 270 extends in a closed loop around the periphery of well 220 and isolates regions 230, 240 and well 220 from the rest of the circuit. For the embodiment illustrated in FIG. 2, P+ region 230 is typically connected to an input/output (I/O) pad or bus and N+ region 240 is connected to ground. Advantageously, gate 260 is also connected to N+ region 240.

As illustrated in FIG. 2, the first conductivity type is P and the second conductivity type is N so that an N well is formed in a P substrate. In accordance with the invention, to minimize capacitance between the well and the substrate the doping level in the well is approximately $1 \times 10^{16}$ atoms/$cm^3$ to $1 \times 10^{18}$ atoms/$cm^3$ and the doping level in the substrate is at the level of native doping, i.e., less than $1 \times 10^{16}$ atoms/$cm^3$ or approximately $10^{15}$ atoms/$cm^3$. In addition, well 220 is isolated within the substrate so that it is surrounded in the substrate by regions of native doping concentration and no other well or highly doped region abuts well 220 or is close enough to it as to affect the capacitance between well 220 and the substrate. P+ region 230 and N+ region 240 are advantageously formed at the same time and using the same processes as the source and drain regions of the MOS transistors located elsewhere in the integrated circuit. Accordingly, they have dopant concentrations that are the same as those in the source and drain regions. Typically, the P+ dopant concentration in region 230 is in the range from $1 \times 10^{18}$ atoms/$cm^3$ to $1 \times 10^{20}$ atoms/cm$^3$; and the N+ dopant concentration in region 240 is in the range from $1\times10^{18}$ atoms/cm$^3$ to $1\times10^{20}$ atoms/cm$^3$.

As will be detailed more fully below, P+ and N+ regions 230, 240 are formed by an ion implantation process in which gate 260 and sidewalls 255 shield the portion of well 220 immediately below them and thereby separate regions 230, 240. Since the dimensions of the gate structures in an integrated circuit can be carefully controlled, it is possible to carefully regulate the distance L between the P+ and N+ regions. And by regulating this distance, the width of the gate in the direction perpendicular to L and the dopant concentration in well 220, the on resistance $R_{on}$ of diode 225 can be controlled.

In an alternative embodiment of the device of FIG. 2, the first conductivity type is N and the second conductivity type is P so that a P well is formed in an N substrate. In this case, the diode is formed at the PN junction between N+ region 230 and P well 220. Doping levels in the substrate, well and P+ and N+ regions are the same as described above for the embodiment shown in FIG. 2.

Figure 3:
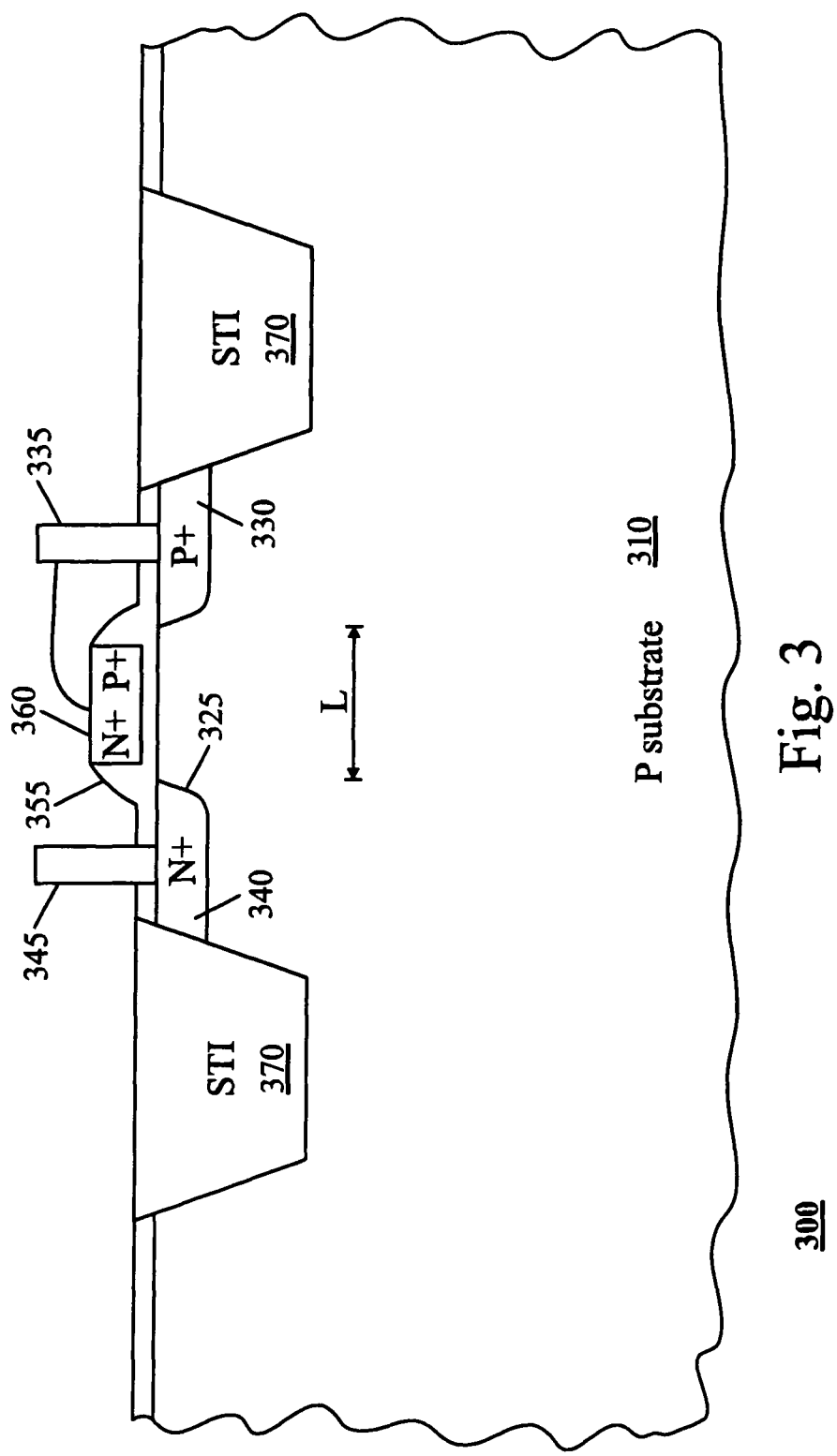
FIG. 3 is a cross-section of a second illustrative embodiment of the invention.

FIG. 3 is a schematic cross-section of a second embodiment of an ESD protection device 300 of the present invention. Again, the area of the cross-section is only a small portion of a much larger integrated circuit in which numerous other devices are formed. Device 300 comprises a substrate 310 of a first conductivity type and highly doped regions 330, 340 of first and second conductivity types located in substrate 310. A diode 325 is formed at a PN junction between region 340 and substrate 310. An insulating layer 350 is formed on a surface of the substrate and a polysilicon gate 360 is located on the insulating layer between the highly doped regions 330, 340. As indicated, the gate is doped with dopants of the first conductivity type adjacent region 330 and the second conductivity type adjacent region 340. The gate has sidewalls 355 of an insulating material that may be the same as that of insulating layer 350. Electrical connection to regions 330, 340 is made by contacts 335, 345, thereby providing connection to the anode and cathode of diode 325. Shallow trench isolation (STI) region 370 extends in a closed loop around the periphery of regions 330, 340 and isolates them from the rest of the circuit. For the embodiment illustrated in FIG. 3, P+ region 330 is connected to ground and N+ region 340 is typically connected to an input/output (I/O) pad or bus. Advantageously, gate 360 is also connected to P+ region 330.

As illustrated in FIG. 3, the first conductivity type is P and the second conductivity type is N. In accordance with the invention, the doping level in the substrate is at the level of native doping, i.e., less than $1\times10^{16}$ atoms/cm$^3$ or approximately $10^{15}$ atoms/cm$^3$, so as to minimize capacitance between the diode and the substrate. P+ region 330 and N+ region 340 are advantageously formed at the same time and using the same processes as the source and drain regions of the MOS transistors located elsewhere in the integrated circuit. Accordingly, they have dopant concentrations that are the same as those in the source and drain regions. Typically, the P+ dopant concentrations in region 230 is in the range from $1\times10^{18}$ atoms/cm$^3$ to $1\times10^{20}$ atoms/cm$^3$; and the N+ dopant concentration in region 340 is in the range from $1\times10^{18}$ atoms/cm$^3$ to $1\times10^{20}$ atoms/cm$^3$.

As will be detailed more fully below, P+ and N+ regions 330, 340 are formed by an ion implantation process in which gate 360 and sidewalls 355 shield the portion of substrate 310 immediately below them and thereby separate regions 330, 340. Since the dimensions of the gate structures in an integrated circuit can be carefully controlled, it is possible to carefully regulate the distance L between the P+ and N+ regions. And by regulating this distance, the width of the gate in the direction perpendicular to L, and the dopant concentration in substrate 310, the on resistance $R_{on}$ of diode 325 can be controlled.

Figure 4:
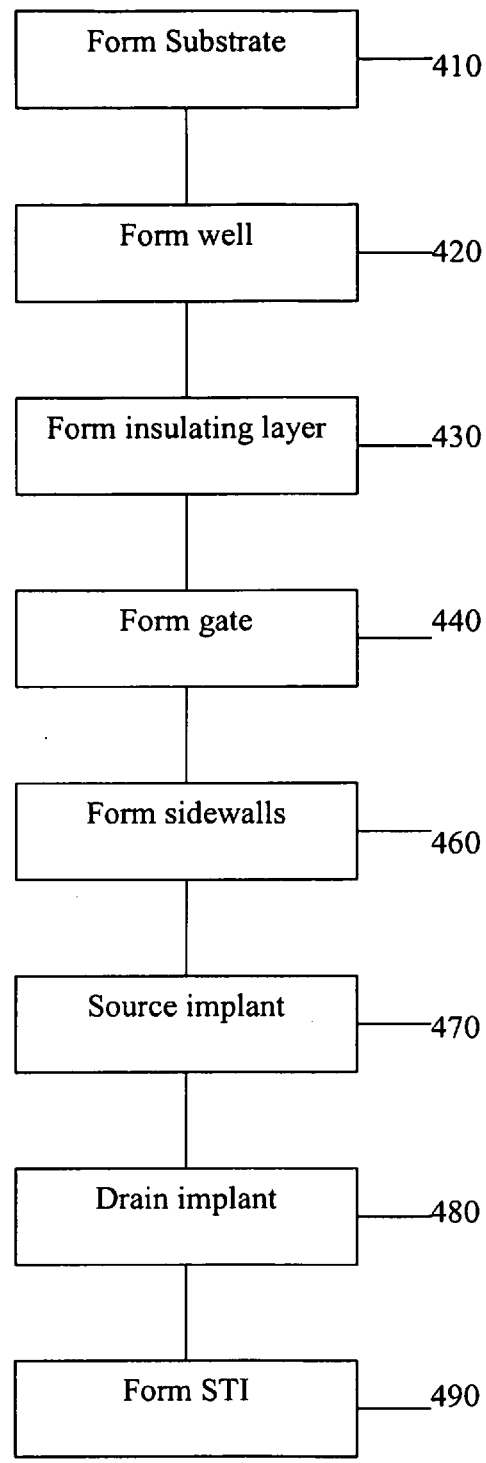
FIG. 4 is a flow chart illustrating the process for making the devices of FIGS. 2 and 3.

The devices of FIG. 2 or FIG. 3 are made at the same time and using the same processes as other devices are formed elsewhere in the integrated circuit. Details of these processes are shown in the flowchart of FIG. 4. The process begins at step 410 with the formation of a semiconductor substrate having a doping concentration that is the native doping level. Illustratively, the substrate is single crystal silicon. Details of the formation of a semiconductor substrate are well known and are described, for example, in chapter 3 of J. D. Plummer et al., *Silicon VLSI Technology Fundamentals, Practice and Modeling* (Prentice Hall 2000), which is incorporated herein by reference.

At step 420 a well is formed in the substrate for those embodiments of the invention that include a well. The well is made by ion implantation of a P-type or N-type dopant on the surface of the substrate depending on whether a P well or N well is to be formed followed by diffusion of the dopants. Typically, boron ions are used for the P-type dopant and phosphorus ions for the N-type dopant. As emphasized above, to minimize capacitance between the well and the substrate, the well is isolated within the substrate so that no other well or highly doped region abuts the well or is close enough to it to affect the capacitance between the well and the substrate. This is to be contrasted with some well formation processes where an N well and P well pair or twin tub are formed in abutting relationship in the substrate.

An insulating layer is then formed at step 430 on the surface of the substrate. Where the substrate is silicon, the insulating layer illustratively is silicon dioxide formed by oxidizing the upper surface of the silicon substrate. Gates are then defined at step 440 on the insulating layer. In addition to forming the gates for the ESD devices, the process advantageously includes the formation of the gates for other devices in the integrated circuit as well. As indicated above, the gate is preferably formed of polysilicon. To form the gates, a polysilicon layer is deposited on the insulating layer and a photolithographic process is used to define the pattern of the gates in the polysilicon and remove the polysilicon from the remainder of the layer.

Following formation of the gates, additional photolithographic processes are used to define regions where N and P lightly doped drain (LDD) implants are to be made and these implants are then made. Since the LDD regions are not used in the devices of FIGS. 2 and 3, no such regions are defined within the cross-sections depicted in FIGS. 2 and 3.

Following formation of the LDD regions elsewhere in the integrated circuit, sidewalls are formed on the sides of the gates at step 460. Next, the source and drain implants are made at steps 470, 480. To define the source regions, a photolithographic mask is used that exposes the region where the source region is to be formed as well as the half of the gate immediately adjacent the source region. Ions are then implanted in the source region and in the exposed half of the gate. For P type implants, boron is typically used; and for N type implants, phosphorus, arsenic or antimony is used. Following the source region implant, the same procedures are used for the drain region implant on the other side of the gate. A mask is used that exposes the region where the drain region is to be formed as well as the half of the gate immediately adjacent the drain region. Ions are then implanted in the drain region and in the exposed half of the gate. As will be recognized by those skilled in the art, the order of formation of the source and drain regions could be reversed. After the source and drain implants are completed, a shallow trench isolation region is formed at step 490 to isolate the ESD device.

Further details about the processing of the substrate are set forth in chapter 2 of J. D. Plummer et al., *Silicon VLSI Technology Fundamentals, Practice and Modeling* (Prentice Hall 2000), which is incorporated herein by reference.

As will be apparent to those skilled in the art, numerous variations may be made within the spirit and scope of the invention.

What is claimed is:

1. An electrostatic discharge (ESD) protection structure comprising:
    a single crystal substrate having dopants of a first conductivity type at a concentration that is less than $1\times10^{16}$ atoms/cm$^3$,
    a polysilicon gate on an insulating layer on the substrate, said gate having first and second sides,
    a P+ region in said substrate on the first side of the gate,
    a N+ region in said substrate on the second side of the gate,
    a P-N junction formed between the substrate and one of the P+ region and the N+ region,
    a shallow trench isolation isolating said first P+ region and said first N+ region from other structures in the substrate.

2. The ESD protection structure of claim 1 wherein the first conductivity type is P type.

3. The ESD protection structure of claim 2 wherein the gate is electrically connected to the P+ region.

4. The ESD protection structure of claim 1 wherein the P+ region and the N+ region are formed in a well in the substrate, the well having a second conductivity type.

5. The ESD protection structure of claim 4 wherein the first conductivity type is P type and the second conductivity type is N type.

6. The ESD protection structure of claim 5 wherein the gate is electrically connected to the N+ region.

7. The ESD protection structure of claim 4 wherein the first conductivity type is N type and the second conductivity type is P type.

8. The ESD protection structure of claim 1 wherein the gate is doped with P type dopants on the first side and N type dopants on the second side.

9. The ESD protection structure of claim 1 wherein the P+ region has dopants at a concentration that is in the range between $1\times10^{18}$ atoms/cm$^3$ and $1\times10^{20}$ atoms/cm$^3$ and the N+ region has dopants at a concentration that is in the range between $1\times10^{18}$ atoms/cm$^3$ and $1\times10^{20}$ atoms/cm$^3$.

10. An electrostatic discharge (ESD) protection structure comprising:
    a single crystal substrate having dopants of a first conductivity type at a concentration that is less than $1\times10^{16}$ atoms/cm$^3$,
    an isolated well in the substrate having dopants of a second conductivity type at a concentration in the range between $1\times10^{16}$ atoms/cm$^3$ and $1\times10^{18}$ atoms/cm$^3$,
    a polysilicon gate over the well on an insulating layer on the substrate, said gate having first and second sides,
    a P+ region in said well on the first side of the gate,
    a N+ region in said well on the second side of the gate,
    a P-N junction formed between the well and one of the P+ region and the N+ region,
    a shallow trench isolation isolating said first P+ region and said first N+ region from other structures in the substrate.

11. The ESD protection structure of claim 10 wherein the first conductivity type is P type and the second conductivity type is N type.

12. The ESD protection structure of claim 11 wherein the gate is electrically connected to the N+ region.

13. The ESD protection structure of claim 10 wherein the first conductivity type is N type and the second conductivity type is P type.

14. The ESD protection structure of claim 10 wherein the gate is doped with P type dopants on the first side and N type on the second side.

15. The ESD protection structure of claim 10 wherein the P+ region has dopants at a concentration that is in the range between $1\times10^{18}$ atoms/cm$^3$ and $1\times10^{20}$ atoms/cm$^3$ and the N+ region has dopants at a concentration that is in the range between $1\times10^{18}$ atoms/cm$^3$ and $1\times10^{20}$ atoms/cm$^3$.

16. A method of making an electrostatic discharge (ESD) device comprising:
    forming an insulating layer on a native single crystal semiconductor substrate having dopants of a first conductivity type at a concentration that is less than $1\times10^{16}$ atoms/cm$^3$,
    forming a polysilicon gate on the insulating layer, said gate having first and second opposing sides,
    implanting in the substrate dopants of a first conductivity type on the first side of the gate to form a first heavily doped region, and
    implanting in the substrate dopants of a second conductivity type on the second side of the gate to form a second heavily doped region,
    wherein a P-N junction is formed between the native semiconductor substrate and the second heavily doped region.

17. The method of claim 16 wherein the first conductivity type is P type.

18. The method of claim 16 further comprising the step of forming in the substrate a well of second conductivity type in which the first and second heavily doped regions are formed, the well being surrounded by the native semiconductor substrate.

19. The method of claim 18 wherein the first conductivity type is P type and the second conductivity type is N type.

20. The method of claim 18 wherein the first conductivity type is N type and the second conductivity type is P type.

* * * * *